United States Patent [19]

Delagebeaudeuf et al.

[11] Patent Number: 4,977,434

[45] Date of Patent: Dec. 11, 1990

[54] FIELD-EFFECT SEMICONDUCTOR DEVICE COMPRISING AN ANCILLARY ELECTRODE

[75] Inventors: Daniel Delagebeaudeuf, Saclay; Henri Derewonko, Voisins le Bretonneux; Jean J. Godart, Boulogne; Patrick Resneau, Boulogne; Pierre Gibeau, Voisins le Bretonneux, all of France

[73] Assignee: Thomson Hybrides et Microondes, Paris, France

[21] Appl. No.: 225,165

[22] Filed: Jul. 28, 1988

[30] Foreign Application Priority Data

Jul. 31, 1987 [FR] France .................. 87 10879

[51] Int. Cl.$^5$ ............................................. H01L 29/80
[52] U.S. Cl. .................................... 357/22; 357/15; 357/23.14; 357/41; 357/46
[58] Field of Search ............... 357/23.14, 41, 46, 15, 357/22

[56] References Cited

U.S. PATENT DOCUMENTS 4,141,023  2/1979  Yamada ........................ 357/23.14
4,313,126  1/1982  Krumm et al. .

OTHER PUBLICATIONS

1978 IEEE MTT-S International Microwave Symposium Digest, Ottawa, Canada, Jun. 27–29, 1978, pp. 309–311, IEEE, N.Y., US Chen, et al.

Primary Examiner—Edward J. Wojciechowicz
Attorney, Agent, or Firm—Oblon, Spivak, McClelland, Maier & Neustadt

[57] ABSTRACT

A field-effect transistor comprises an ancillary electrode in addition to the source, gate and drain electrodes. In this device, a semiconducting body bears source, gate and drain metallizations which define a main transistor. The metallization of the drain is separated into two parts which are separated by a channel on which is placed a second gate metallization defining a secondary transistor. The two parts of the drain are coupled by this secondary transistor, the channel of which is separated from the main channel. The secondary transistor can be used to control the gain of the main transistor or to modulate its amplitude signal or to mix two frequencies addressed on the two gates.

7 Claims, 1 Drawing Sheet

FIELD-EFFECT SEMICONDUCTOR DEVICE COMPRISING AN ANCILLARY ELECTRODE

BACKGROUND OF THE INVENTION

1. Field of the Invention

The present invention concerns a field-effect semiconducting device, the gain of which can be controlled by a DC voltage. The control of the gain is achieved by separating the drain metallization into two parts which are separated from each other by a secondary gate metallization, constituting a variable resistor which couples the two parts of the drain variably. The transistor according to the invention thus has two channels and two gates, but the two gates are not in the same channel.

2. Description of the Prior Art

Two-gate or multiple-gate field-effect transistors are well-known but, as a rule, the gates are parallel to one another and interposed in one and the same channel between a source and a drain. Furthermore, the fact of placing several gates that exert their effect on a single channel is used in logic circuits to make AND gates for example. When prior art single-gate or two-gate transistors are used for functions of gain control, modulation or mixing, they operate in the non-linearity region of their transconductance curve, namely in the vicinity of the pinch-off region for a single-gate transistor. This region corresponds to low transconductance values which change very quickly as a function of the level of the input signal, thus giving rise to either a small dynamic range or considerable distortion and very low conversion gain.

On the contrary, the transistor according to the invention does not use the non-linearity of transconductance. Through its two channels, it separates the "signal" and "control" paths and, if it is used as a mixer for example, it operates by multiplication.

The transistor according to the invention has a semiconductor body consisting of a substrate and different layers which need not be examined in detail since the invention concerns contact-making metallizations. A source metallization and a gate metallization are deposited on the upper surface of this semiconductor body and, at the locations made necessary by the internal structure of the transistor (depending on whether it has contact-making pads, or a mesa or a recess etc.). This source metallization and gate metallization conform to the prior art and form part of the main transistor. But the metallization of the drain of this transistor is divided into two parts. The two parts of the drain metallization have no contact with each other (unless it is through the external bias circuit) and the distance between them is enough for a second gate metallization to be inserted therein. This second gate is in a channel which is distinct from the channel of the main transistor. The two drain metalizations and the second gate metalization define a secondary field-effect transistor in the subjacent layers, the control of this secondary field-effect transistor makes it possible to couple the two drains variably.

SUMMARY OF THE INVENTION

More precisely, the invention concerns a field-effect semiconductor device comprising a semiconductor body formed by a substrate and at least one active layer as well as a source, first gate and drain metallizations which define a main transistor, wherein the drain metallization is made up of two parts that are separated from each other by a channel of semiconductor material, on which a second gate metallization is deposited, the two drain metallization parts and the second gate metallization defining a second transistor, the channel of which is separated from the channel of the main transistor.

BRIEF DESCRIPTION OF THE DRAWING

The invention will be better understood from the following detailed description of an embodiment of the invention, and its operation and advantages will become clearer from the appended figures, of which.

DESCRIPTION OF THE PREFERRED EMBODIMENT

Figure 1:
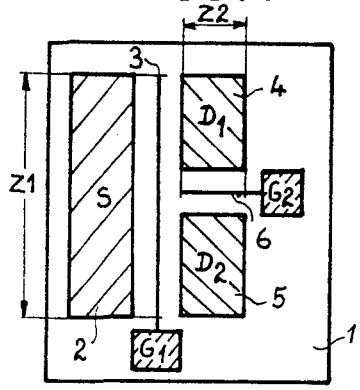
FIG. 1 shows a plane view of the metallizations of a field-effect transistor according to the invention.

FIG. 1 gives a plane view of a transistor according to the invention, seen from the side bearing the access electrode metallizations. This transistor has a semiconductor body 1 which need not be examined in detail. This semiconductor body may be made of silicon or of fast materials of the III/IV group such as GaAs. On the substrate of this semiconductor body 1, there are placed a number of semiconducting layers with architecture such that they form a transistor. This architecture is outside the field of the invention. It suffices for it to be consistent with the contact-making metallizations for which the representation shown is just one, non-restrictive example of the invention.

On the main face of the semiconductor body 1 and on the active layer or layers, a source metallization 2 and a gate metallization 3, with a width $z_1$, are deposited. But, unlike in the prior art, the drain metallization is separated into two drain metallizations D1 and D2, marked 4 and 5, which are geometrically isolated. They leave a space between them wherein a second gate G2 metallization 6 is deposited.

The channel between the two drain metallizations, 4 and 5, can be made so as to be in any position which is not necessarily the middle position with reference to the gate 3. But this channel is distinct from the channel supporting the gate 3. Thus, a second channel is defined. This second channel is distinct from the channel of the main transistor, and the drain metallizations 4 and 5 form a secondary or coupling transistor, the gate 6 of which couples the two parts 4 and 5 of the drain variably. As a non-restrictive example, the channel of the secondary transistor is shown in FIG. 1 as being perpendicular to the channel of the main transistor, but it can have any angle with it or be parallel to it. It is then separated from it by one of the two drain metallizations 4 or 5.

Figure 2:
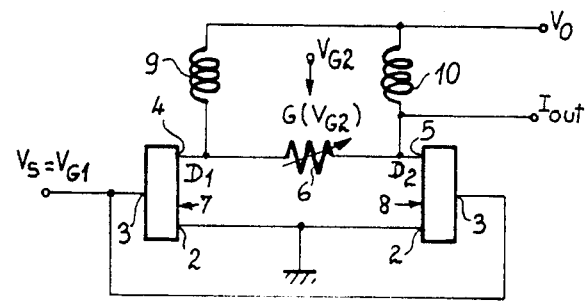
FIG. 2 shows an equivalent electrical circuit diagram of the transistor according to the invention.

FIG. 2 gives the electrical equivalent circuit of the drawing of FIG. 1. There are two field-effect transistors 7 and 8 (which constitute the main transistor 2, 3 (4+5)) in parallel, mounted as common sources 2 having a same gate 3, but with their drains 4 and 5 connected by a coupling transistor which behaves like a variable resistor controlled by a voltage $V_{G2}$ applied to the second gate 6. Of course, for the coupling transistor to function, the two metallizations 4 and 5 should be suitably biased, with one acting as a source and the other acting as a drain of the coupling transistor.

Several modes of operation of the transistor according to the invention are possible, depending on whether the coupling transistor is saturated or not. The most worthwhile mode assumes a potential difference between the drains $D_1$ and $D_2$ which is low at all and, (in particular, the bias DC voltages of the drains $D_1$ and $D_2$ should be practically equal so that only the low dynamic potential differences $VD_2-VD_2$ are taken into consideration. The transistor according to the invention is therefore a low-level transistor but not a power transistor.

This condition is met by connecting the drains $D_1$ and $D_2$ to a common voltage source $V_0$ through two chokes, 9 and 10, of sufficiently high value. The gate G2 is connected to a bias voltage $V_{G2}$. The conducting channel of the coupling transistor can then be likened to a pure resistor with a value depending on the voltage $V_{G2}-V_0$: This resistor couples the two drains $D_1$ and $D_2$ variably.

Figure 3:
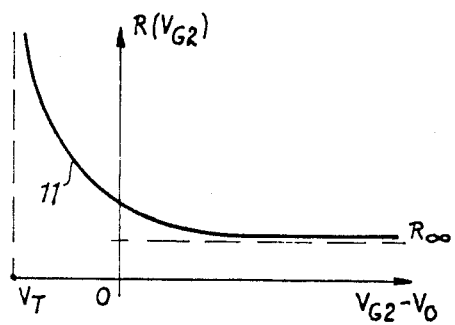
FIG. 3 shows the resistance curve of the channel of a transistor as a function of the voltage difference between gate and drain.

FIG. 3 shows the qualitative shape of the variation of the resistance R of this resistor as a function of the difference in voltages $V_{G2}-V_0$, given on the X-axis. The Y-axis indicates the value of R for a control voltage $V_{G2}$. It is known that R is infinite for any value of the gate voltage smaller than the threshold voltage $V_T$, and that R tends towards an asymptotic value R for an infinite value of the gate voltage. The example shown is valid for a normally off (N-off) transistor, but this line of thinking and the curve can be transposed to a normally on (N-on) transistor. This curve 11 is substantially hyperbolic in its useful part between $V_T$ and a finite bias voltage, and therefore has the form 1/x.

Figure 4:
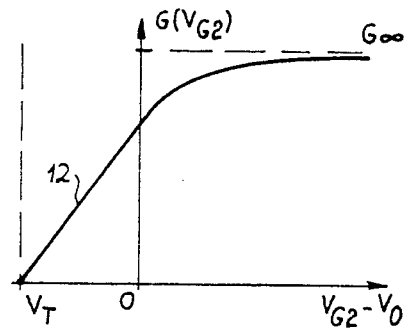
FIG. 4 shows a conductance curve under the conditions of FIG. 3.

If, therefore, the conductance of the coupling transistor is carried on to FIG. 4 as a function of the same variable $V_{G2}-V_0$:

$$G_{(VG2)} = 1/R_{(VG2)}$$

The curve 12 ia almost linear in a considerable range of the voltage $V_{G2}-V_0$. Besides, this linearity is better for a two-dimensional electron gas transistor of the TEGFET type than for a field-effect homojunction transistor of standard structure.

In the case of the transistor according to the invention, as shown schematically in FIG. 2, the input AC signal VS is applied to the first gate $G_{1(VS=VG1)}$ of the main transistor, and the output signal $I_{out}$ is picked up at one of the two drain metallizations, $D_2$ for example. Assuming the conditions stated above (with a low-level transistor) and assuming, to simplify the description, that the output feedback elements ($G_{ds}$) can be overlooked, the variable components of the currents and voltages rre related by the equation:

$$\Delta I_{out} = K(g_m \Delta V_S + g_d \Delta V_{D2})$$

wherein:
$g_m$ is the transconductance of each of the two active transisters.
$g_d$ is the conductance of the corresponding output,
$\Delta V_S$ is the voltage of the input signal $\Delta V_D$ is the AC component of the voltage on the drain,
K is a modulating term, which is a multiplying factor of the output current as a function of the control voltage $V_{G2}$, and is defined by:

$$K = \frac{2\frac{G_{(VG2)}}{g_d} + 1}{\frac{G_{(VG2)}}{g_d} + 1}$$

where G is the conductance of the coupling or secondary transistor.

If $G_{VG2}\infty$, K=2: the drains $D_1$ and $D_2$ are short-circuited by a conducting secondary channel, with null resistance, and we are in the case where the two transistors, namely the main transistor and the secondary transistor, add together only their contributions. The transistor operates like an ordinary transistor having only one drain.

In the more general case, where $G_{VG2}$ has a finite value, determined according to the linear part of the straight line 12 in FIG. 4, everything happens as if the cumulated widths $Z_1$ and $Z_2$ of the gates of the two transistors were multiplied by a factor K, ranging from 1 to 2, and depending on the control voltage $V_{G2}$.

Furthermore, the computation shows that, at a given control voltage $V_{G2}$, the factor K depends essentially on the ratio $Z_1/Z_2$ of the widths of the gates, $G_1$ and $G_2$, of the main and secondary transistors. This factor K should therefore be adjusted by construction. The width $Z_1$ being imposed by the characteristics of use of the main transistor, it is always possible to give the drain metallizations, $D_1$ and $D_2$, dimensions by which the desired width $Z_2$ can be obtained for the gate $G_2$.

A first application of the device according to the invention is the gain control. For, the transistor according to the invention constitutes a transistor with variable gain which can be controlled by the voltage $V_{G2}$, applied to the gate of the secondary transistor. By making the control voltage $VG_2$ vary, the gain of the main transistor can be made to vary. Given present-day technology and the finite voltages that can be really applied to a transistor, a variation of about 3 dB is then possible in the power gain.

A second application of the device according to the invention is the amplitude modulation. A variable voltage is applied to the gate G2 of the coupling transistor. This variable voltage modulates the signal $V_S$ addressed to the gate G1 of the main transistor. In this case, it is preferable to design the device and to bias the secondary transistor accordingly so that:

$$\frac{G_{(VG2)}}{g_d} \leq 0.5$$

a value for which the depth of modulation, in the active layer, is almost linear as a function of the modulation voltage $V_{G2}$.

The most worthwhile application of the device according to the invention concerns the mixing of frequencies of signals between an input signal $V_S$, addressed at the first gate G1, and a local oscillator signal, for example, addressed at the second gate G2.

Figure 5:
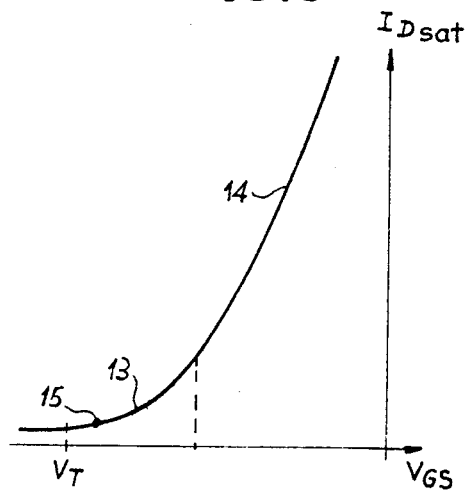
FIG. 5 shows a transfer curve of a field-effect transistor.

The value of this mixer will be seen more clearly from a preliminary description, as a reminder, of the mixing conditions in a prior art transistor. FIG. 5 gives the transfer curve of a standard field-effect transistor, namely the curve of the drain current $I_{Dsat}$, as a function of the difference in potential between gate and source $V_{GS}$. This curve has a part 13 which is quadratic, and hence non-linear, and a part 14 which tends towards linearity.

For a standard single-gate or two-gate transistor, the mixing can be done only in the non-linear part: it can be easily understood that the equation of the transfer curve should have the form $m=(a+b)^n$, with $n=2, 3, 4 \ldots$ to obtain terms in nab. If $n=1$, there is no mixing of frequencies. Hence, with a standard transistor, the gate or gates are biased in such a way that the transistor works in a region of maximum non-linearity: for example in the neighborhood of the pinch-off voltage $V_T$ at a point such as 15.

Then, an operation of this type generates a great number of high frequency and low frequency harmonics: this number is all the greater as the non-linearity index n is high. The undesired harmonics therefore have to be filtered out.

These drawbacks come from the fact that the same conducting channel is used between source and drain to fulfill several different functions. If there are several gates, they are arranged in parallel on this single channel.

On the contrary, in the device according to the invention, the "signal" and the "control" paths are distinctly separated into two transistor channels which are separate from each other, and the channels are mixed by product or by multiplication (factor K) in conditions such that the transconductance is linear (corresponding to the straight line 12 of FIG. 4). If it is agreed to consider the main transistor as being the "signal" channel, the transconductance of the signal channel can be set by adequate biasing to give maximum performance: thus a considerable conversion gain is achieved.

Furthermore, taking $\omega_S$ to be the angular frequency of a signal addressed at the first gate $G_1$ and $\omega_{ol}$ to be the angular frequency of the local oscillator addressed at the second gate G2, because of the almost linear characteristic curve of G(VG2) as a function of $V_{G2}$ (and for a suitable DC bias of the gate G2), the mixer according to the invention generates, apart from $\omega_S$ and $\omega_{ol}$, only the frequencies $\omega_{ol}-\omega_S$ and $\omega_{ol}+\omega_S$, regardless of the level of the local oscillator. If, for example, $\omega_{ol}-\omega_S$ is the frequency sought $\omega_{ol}+\omega_S$ is called its image frequency. The mixer according to the invention therefore gives a spectrum which comprises only one mixing frequency and its image frequency: the filtering problems are thereby simplified.

Figure 6:
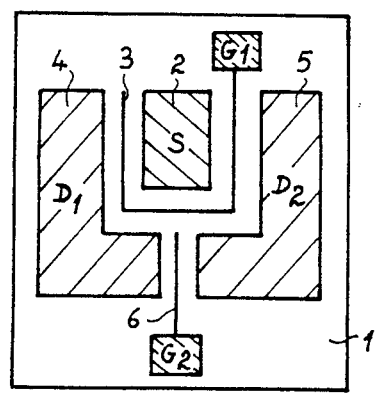
FIG. 6 shows an example of a possible alternative metallization of a transistor according to the invention.

The geometry of the electrode metallizations of the transistor according to the invention is not limited to the one shown in FIG. 1. Another example of this geometry is given in FIG. 6 wherein the drain region and its electrodes $D_1$ and $D_2$ surround the region of the source. Of course, the internal transistor structure should correspond to the geometry of the electrodes. In this latter example, the drain is, according to the invention, cut into two parts separated by a channel which is substantially perpendicular to the channel of the main transistor. Other configurations are possible, and the secondary channel can have an angle with the main channel: what is important is that the two channels should be distinctly separate and should work independently.

This configuration can be applied to interdigitated transistors if the transistor does not have a great number of fingers and remains within the field of small signal transistors.

The structure of the metallizations according to the invention can be applied to all transistors working at low frequency and made of silicon or transistors working at high frequencies and made of fast materials of the III–IV group such as GaAs. However, it is more especially valuable when the semiconductor body of the transistor has a heterojunction with the presence of two-dimensional electron gas.

These transistors are used especially in telecommunications and signal processing, in radar for example, for amplitude modulation and for mixing frequencies.

What is claimed is:

1. A field-effect semiconductor device comprising:
   a semiconductor body formed by a substrate, a source, and at least one active layer;
   a first gate metallization;
   a drain metallization made up of two parts, wherein said first gate metallization and said drain metallization define a main transistor with a main channel formed between said gate and drain metallizations, and wherein said two drain metallization parts are separated from each other by a second channel of semiconductor material;
   a second gate metallization deposited on said second channel of semiconductor material;
   said two drain metallization parts, said second gate metallization and said second channel defining a second transistor.

2. A device according to claim 1 wherein the second channel of the second transistor is distinct from the channel of the main transistor.

3. A device according to claim 1 wherein the two drain metallizations are biased by a DC voltage $V_0$ through two chokes of high value, and wherein the second gate is biased by a control voltage $V_{G2}$.

4. A device according to claim 1 wherein the secondary transistor behaves like a variable resistor which couples the two parts of the drain metallizations, said coupling being a function of the difference in potentials $V_{G2}-V_O$.

5. A device according to claim 3 wherein the gain of the main transistor is controlled by the voltage $V_{G2}$ applied to the gate of the second transistor.

6. A device according to claim 3 wherein the amplitude of the output signal $I_{out}$ of the main transistor is modulated by a variable voltage VG2 applied to the gate of the second transistor.

7. A device according to claim 3 comprising a mixer of frequencies between a signal $V_S$ applied to the first gate and a signal $V_{G2}$ applied to the second gate, the mixing of the frequencies being done by multiplication by the factor K.

* * * * *